(12) United States Patent
Granfors et al.

(10) Patent No.: US 7,081,628 B2
(45) Date of Patent: Jul. 25, 2006

(54) SPATIALLY PATTERNED LIGHT-BLOCKING LAYERS FOR RADIATION IMAGING DETECTORS

(75) Inventors: Paul Richard Granfors, Sunnyvale, CA (US); Richard Aufrichtig, Mountain View, CA (US); Douglas Albagli, Clifton Park, NY (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 324 days.

(21) Appl. No.: 10/705,091

(22) Filed: Nov. 10, 2003

(65) Prior Publication Data

US 2005/0098731 A1 May 12, 2005

(51) Int. Cl.
*G01T 1/24* (2006.01)
(52) U.S. Cl. .............. 250/370.11; 250/370.09; 378/98.8
(58) Field of Classification Search ........... 250/370.11, 250/370.09, 370.08, 208.1, 338.4, 370.14; 378/98.8
See application file for complete search history.

(56) References Cited

U.S. PATENT DOCUMENTS

| 4,904,056 | A | * | 2/1990 | Castleberry | 349/162 |
| 6,393,098 | B1 | * | 5/2002 | Albagli | 378/98.2 |
| 6,396,046 | B1 | | 5/2002 | Possin et al. | |
| 6,437,338 | B1 | * | 8/2002 | Hoffman | 250/370.09 |
| 6,784,434 | B1 | * | 8/2004 | Hennessy et al. | 250/370.14 |
| 2003/0201396 | A1 | * | 10/2003 | Lee | 250/370.09 |
| 2003/0234364 | A1 | * | 12/2003 | Hennessy et al. | 250/370.14 |

* cited by examiner

*Primary Examiner*—David Porta
*Assistant Examiner*—Faye P Boosalis
(74) *Attorney, Agent, or Firm*—Dougherty Clements; Christopher L. Bernard; Peter J. Vogel

(57) ABSTRACT

Spatially patterned light-blocking layers for radiation imaging detectors are described. Embodiments comprise spatially patterned light-blocking layers for an amorphous silicon flat panel x-ray detector, wherein the spatially patterned light-blocking layer blocks light from a predetermined number of switching elements in the detector, wherein the predetermined number comprises less than all of the switching elements in the detector. These light-blocking layers may block light from each switching element in a predetermined arrangement of switching elements that are read out last, or in any other suitable pattern.

16 Claims, 5 Drawing Sheets

SPATIALLY PATTERNED LIGHT-BLOCKING LAYERS FOR RADIATION IMAGING DETECTORS

FIELD OF THE INVENTION

The present invention relates generally to radiation imaging. More specifically, the present invention relates to amorphous silicon flat panel detectors having a light-blocking layer over some of the field effect transistors (FETs) therein to prevent those FETs from being exposed to light in an attempt to prevent or minimize artifacts caused by FET photoconduction while causing a minimal increase, if any, in data line capacitance and electronic noise.

BACKGROUND OF THE INVENTION

With applications ranging from diagnostic procedures to radiation therapy, the importance of high-performance medical imaging is immeasurable. As such, new advanced medical imaging technologies continue to be developed. Some such imaging systems utilize amorphous silicon flat panel x-ray detectors.

Generally, in amorphous silicon flat panel x-ray detectors, an amorphous silicon array is disposed on a glass substrate, and a scintillator is disposed over, and is optically coupled to, the amorphous silicon array. The amorphous silicon array comprises pixels, typically arranged in a matrix of rows and columns. During operation, an x-ray source emits a beam of x-rays towards the scintillator, which absorbs the x-ray photons and converts them to visible light. The amorphous silicon array then detects the visible light and converts it into electrical charge. The electrical charge at each pixel on the amorphous silicon array is then read out digitally by low-noise electronics, and is sent to an image processor. Thereafter, the image is displayed on a display, and may also be stored in memory for later retrieval.

Optimal images, both in terms of resolution and contrast, are achieved when the scintillator absorbs the incident x-ray photons and emits visible light in response thereto that is detected substantially only by the photodiodes that are directly underlying the regions of the scintillator where the x-ray photons were first absorbed. However, in practice, the visible light is generated not only over the photodiodes, but also over other areas of the panel. Additionally, the visible light may be scattered so that not all light generated at one position strikes the amorphous silicon array directly underlying that position. Furthermore, due to its photoconductive nature, a FET that is exposed to light may become conductive and allow charge to leak through it when the gate voltage is held low. This leaking charge may then be read out as an added signal in pixels on the same data line that are read out before the leaking FET. To prevent this from happening, a light-blocking layer is often utilized over the FETs to prevent the FETs from being exposed to light.

While light-blocking layers have many benefits, there are also drawbacks to using them as they currently exist. Existing light-blocking layers, such as those described in U.S. Pat. No. 6,396,046 (issued to Possin et al.), cover all the FETs in the amorphous silicon array to prevent the FETs from being exposed to light. This is more cover than is needed to get rid of artifacts caused by FET photoconductivity. Additionally, in some detectors, the light-blocking layer comprises a layer close to the data line, which increases the capacitive coupling between the data line and the light-blocking layer. This causes an increase in electronic noise.

Since light can cause FET photoconductivity, which can significantly degrade the performance of an amorphous silicon flat panel x-ray detector, improved light-blocking layers are needed. Therefore, it would be desirable to have light-blocking layers that prevent or minimize artifacts caused by FET photoconduction, while causing a minimal increase, if any, in data line capacitance and electronic noise. It would also be desirable to have light-blocking layers that are patterned so as to block light from only a portion of the total number of FETs in the device. It would be even further desirable to have light-blocking layers that are patterned so as to block light from only those FETs in the device that are read out last, since they are the major contributors to the FET photoconductive leakage problem.

SUMMARY OF THE INVENTION

Accordingly, the above-identified shortcomings of existing light-blocking layers are overcome by embodiments of the present invention, which relates to light-blocking layers that are patterned so as to block light from only a portion of the total number of FETs in the device. Embodiments of this invention have light-blocking layers that are patterned so as to block light from only those FETs in the device that are read out last, since they are the major contributors to the FET photoconductive leakage problem. These light-blocking layers are useful for radiation imaging, such as in amorphous silicon flat panel x-ray detectors.

Embodiments of this invention comprise spatially patterned light-blocking layers for amorphous silicon flat panel x-ray detectors. These spatially patterned light-blocking layers block light from a predetermined number of switching elements in the detector, wherein the predetermined number comprises less than all of the switching elements in the detector. These light-blocking layers may block light from each switching element in a predetermined arrangement of switching elements that are read out last, or in any other suitable pattern.

These light-blocking layers may be incorporated into an existing layer in the amorphous silicon flat panel x-ray detector, or they may comprise an additional layer in the amorphous silicon flat panel x-ray detector.

These light-blocking layers comprise a material that is opaque to light, such as for example, light-absorbing conductive metals/materials, semiconductor materials, light-absorbing nonconductive materials, metal oxides, metal compounds, molybdenum (Mo), aluminum (Al), tantalum (Ta), tungsten (W), chromium (Cr), silver (Ag), titanium (Ti), tin (Sn), zirconium (Zr), gold (Au), p+ amorphous silicon, n+ amorphous silicon, undoped amorphous silicon, and/or "black" polyimide.

Embodiments of this invention comprise radiation imaging detectors. These detectors comprise: a detector substrate; an amorphous silicon array disposed on the detector substrate, the amorphous silicon array comprising: a plurality of light-sensitive imaging elements; and a plurality of switching elements, each switching element operatively coupled to an associated light-sensitive imaging element; a scintillator disposed over and optically coupled to the amorphous silicon array; and a spatially patterned light-blocking layer positioned to block light from a predetermined number of switching elements in the detector, wherein the predetermined number comprises less than all of the switching elements in the detector.

Each switching element may comprise a field effect transistor. Each light-sensitive imaging element may comprise a photodiode or a phototransistor.

These radiation imaging detectors may be used for medical imaging, nondestructive testing of parts, and/or detecting contraband.

Further features, aspects and advantages of the present invention will be more readily apparent to those skilled in the art during the course of the following description, wherein references are made to the accompanying figures which illustrate some preferred forms of the present invention, and wherein like characters of reference designate like parts throughout the drawings.

DESCRIPTION OF THE DRAWINGS

The systems and methods of the present invention are described herein below with reference to various figures, in which.

DETAILED DESCRIPTION OF THE INVENTION

For the purposes of promoting an understanding of the invention, reference will now be made to some preferred embodiments of the present invention as illustrated in FIGS. 1–5 and specific language used to describe the same. The terminology used herein is for the purpose of description, not limitation. Specific structural and functional details disclosed herein are not to be interpreted as limiting, but merely as a basis for the claims as a representative basis for teaching one skilled in the art to variously employ the present invention. Any modifications or variations in the depicted structures and methods, and such further applications of the principles of the invention as illustrated herein, as would normally occur to one skilled in the art, are considered to be within the spirit and scope of this invention.

This invention attempts to strike a balance between preventing FET photoconduction and minimizing capacitive coupling and electronic noise by providing light-blocking layers that are patterned so as to block light from only a portion of the total number of FETs in the device. These light-blocking layers may be used in radiation imaging, for example, in amorphous silicon flat panel x-ray detectors.

Figure 1:
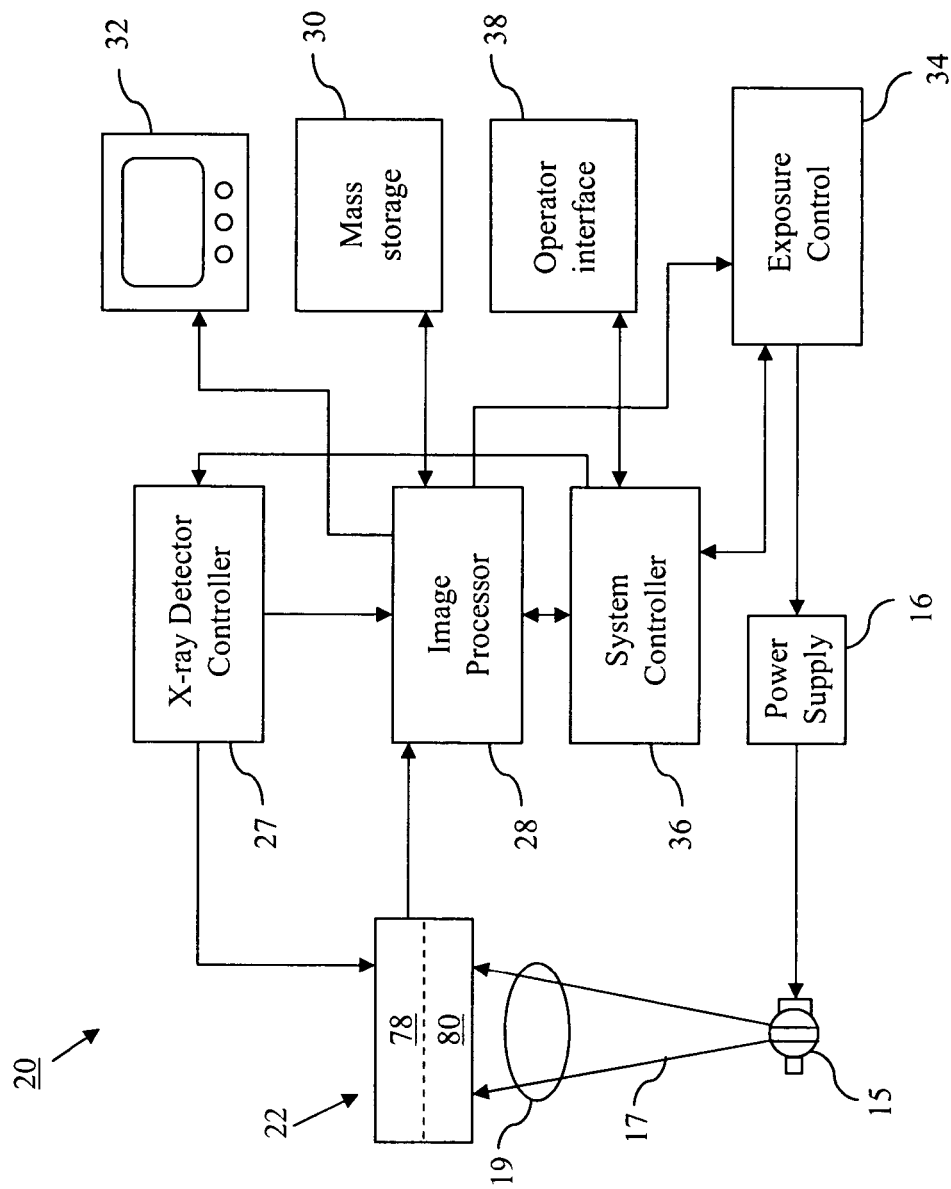
FIG. 1 is a schematic diagram showing the architecture of a radiation imaging system, as utilized in embodiments of this invention.

Referring now to FIG. 1, there is shown a schematic diagram showing the architecture of a radiation imaging system 20, as utilized in embodiments of this invention. The radiation imaging system 20 generally comprises an x-ray source 15, an x-ray detector 22, and an x-ray detector controller 27 that contains electronics for operating the x-ray detector 22. During operation, x-rays 17 are directed from the x-ray source 15 towards the x-ray detector 22, which comprises a scintillator 80 and an amorphous silicon array 78 (which comprises photodiodes 41 and field effect transistors (FETs) 42). After passing through an object being imaged (i.e., a patient 19), the x-rays 17 fall upon scintillator 80, where the x-ray photons are absorbed and converted to visible light. The photodiodes 41 in the amorphous silicon array 78 then detect the visible light that is emitted from the scintillator 80 and convert the detected visible light to an electrical charge. Each photodiode 41 is of large enough area to ensure it will intercept a sizeable portion of the visible light produced by the scintillator 80. Each photodiode 41 also has a relatively large capacitance that allows it to store the electrical charge that results from the photon excitation. The FETs 42 isolate the photodiodes 41 so that the electrical charge stored therein can be read out when desired. The electrical charge, once read out, is then digitized and sent to an image processor 28, where the image signal is processed and enhanced. The processed image may then be displayed on a cathode ray tube display 32, or other suitable display, and/or the image can be stored in mass storage 30 for later retrieval. The image processor 28 can also produce a brightness control signal which can be applied to an exposure control circuit 34 to regulate the power supply 16, which can thereby regulate the x-ray source 15. The overall operation of the x-ray system may be governed by a system controller 36, which may receive commands from operator interface 38. Operator interface 38 may comprise a keyboard, touchpad, or other suitable input device. An associated cathode ray tube display 32 (or other suitable display) may allow the operator to view the reconstructed image and other data from the image processor 28. The operator supplied commands and parameters may be used by the system controller 36 to provide control signals and information to the image processor 28, the x-ray detector controller 27, and/or the exposure control circuit 34.

Embodiments of the present invention may make use of software or firmware running on the system controller 36 to carry out the processing of data in the methods and systems of this invention. A mouse, pointing device, or other suitable input device may be employed to facilitate the entry of data and/or image locations, etc. Other embodiments of this invention may utilize a general purpose computer or workstation having a memory and/or printing capability for storing or printing images. Suitable memory devices are well known and include, but are not limited to, RAM, diskettes, hard drives, optical media, etc. Embodiments using stand-alone computers or workstations may receive data therefrom via conventional electronic storage media and/or via a conventional communications link, and images may then be reconstructed therefrom.

Figure 2:
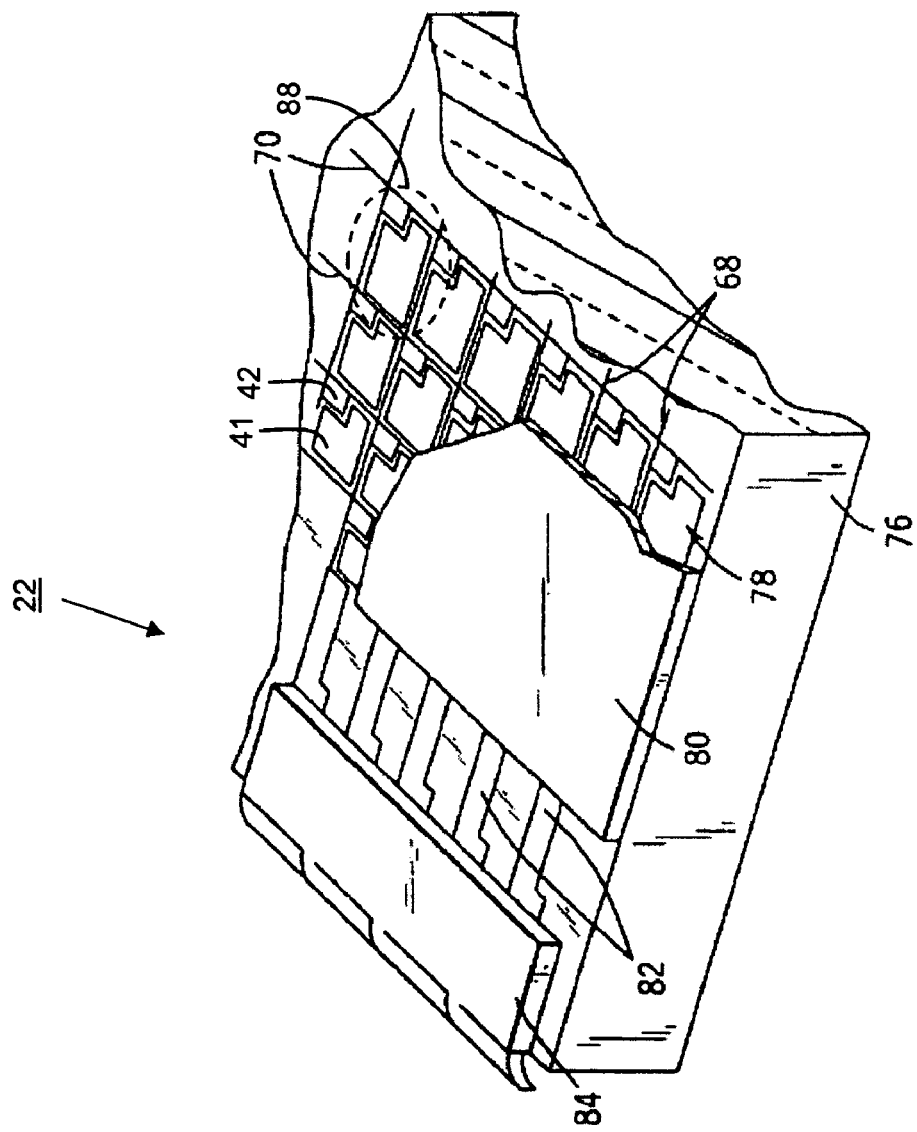
FIG. 2 is a schematic diagram showing the components of an exemplary single piece amorphous silicon flat panel x-ray detector, as utilized in embodiments of this invention.

Referring now to FIG. 2, there is shown an exemplary amorphous silicon flat panel x-ray detector 22, as utilized in embodiments of this invention. Generally, column electrodes 68 and row electrodes 70 are disposed on a single piece glass substrate 76, and an amorphous silicon array 78 is defined thereby. Each pixel 88 in the amorphous silicon array 78 comprises a light-sensitive imaging element or photosensor, such as photodiode 41, and an associated switching element, such as field effect transistor (FET) 42, which acts as a switch to control the charging of the photodiode 41. The source of each FET 42 is connected to an associated photodiode 41, and the drain of each FET 42 is connected to readout electronics via data lines 68, contact fingers 82, and/or contact leads 84. The column electrodes 68 operate as data lines, and the row electrodes 70 operate as gate lines or scan lines, wherein each pixel is addressable by one data line and one scan line. The column electrodes 68, together with contact fingers 82 and contact leads 84, connect each pixel to the circuitry in the readout circuit. The column electrodes 68 and the row electrodes 70 comprise a conductive material such as molybdenum (Mo), aluminum (Al), tantalum (Ta), tungsten (W), chromium (Cr), or the like.

A scintillator 80 is disposed over the amorphous silicon array 78, and is optically coupled thereto. The scintillator 80, which may comprise a dose-efficient cesium iodide scintillator, receives and absorbs x-ray radiation during operation, and converts the x-ray photons therein to visible light. The photodiodes 41 in the high fill factor amorphous silicon array 78 detect the visible light that is emitted from the scintillator 80, and convert the detected visible light into an electrical charge, which is then stored therein in proportion to the visible light that each photodiode 41 detects.

During operation, the voltage on the scan lines (i.e., row electrodes 70) is switched on, thereby switching on the FETs 42, which allows the stored charge on each scanned line's photodiodes 41 to be read out via the data lines (i.e., column electrodes 68). The photodiodes 41 are isolated by holding the gates of the FETs 42 at a negative voltage, thereby making the FETs 42 non-conductive. To read out the charge on each photodiode 41, each FET 42 is made to conduct by pulsing the gate voltage high. The charge at each pixel is then read out and digitized by low-noise electronics (via data lines 68, contact fingers 82 and contact leads 84), and is thereafter sent to an image processor 28.

Figure 3:
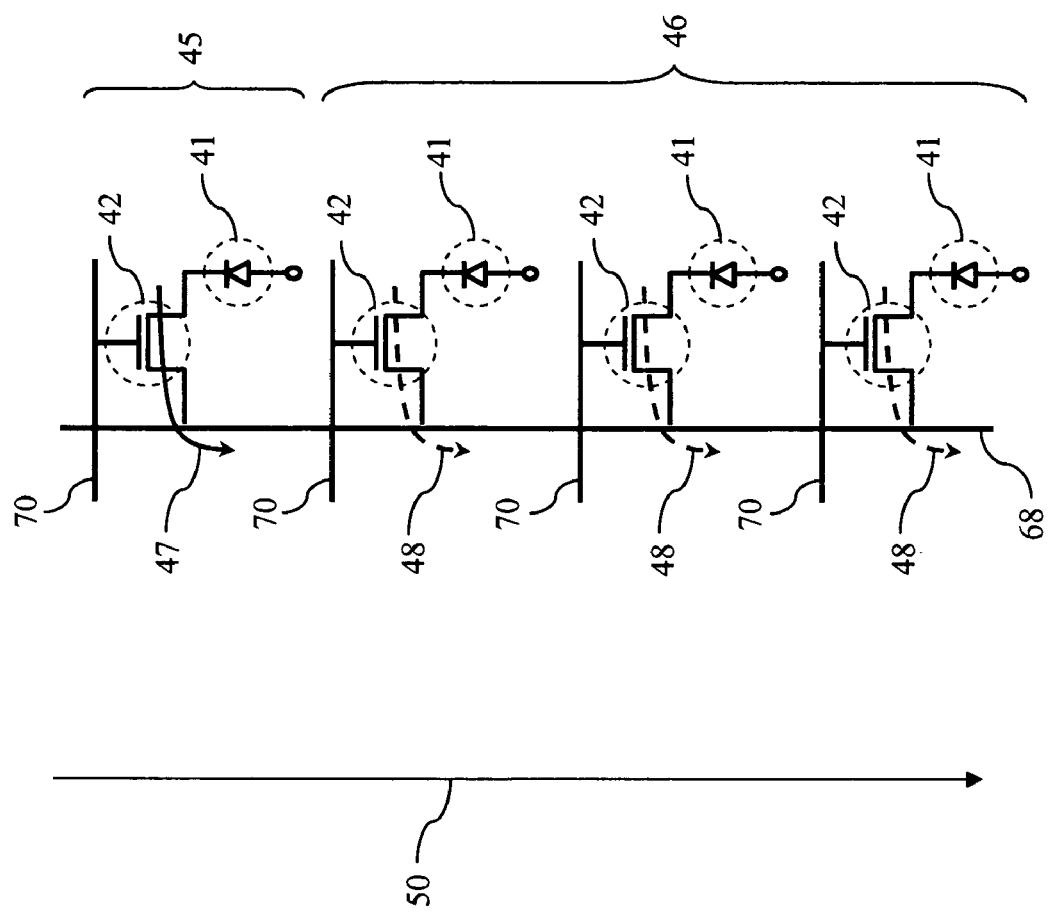
FIG. 3 is a schematic diagram showing how signal leaking out from unread FETs adds to the signal being read from prior FETs on the same data line.

In some circumstances, the FETs 42 become conductive when exposed to light. This causes charge to leak out of the photodiodes 41 while the gate voltage is being held low. The leaking charge 48 leaks out from the unread pixels 46 onto the data line 68, where it is recorded as incorrect signal 48 added to the actual correct signal 47 from the pixel that is currently being read at that time 45. Thus, a FET 42 that is made to conduct by light causes spurious signals that are attributed to pixels on the same data line that are read out before the leaking pixel. FIG. 3 shows how signal leaking out 48 from unread pixels 46 adds to the signal 47 being read from prior pixels 45 on the same data line 68. The readout direction of this panel is shown by arrow 50.

Light-blocking layers are commonly used over the photosensitive regions of the FETs to prevent the FETs from being exposed to light and becoming photoconductive. However, existing light-blocking layers cover all the FETs in the amorphous silicon array, which likely provides more light blocking than is necessary to prevent imaging artifacts due to FET photoconductivity. Additionally, in some detectors, the light-blocking layers are disposed in a layer close to the data lines 68, which increases the capacitive coupling between the data lines 68 and the light-blocking layer. This causes increased electronic noise. Therefore, this invention utilizes spatially patterned light-blocking layers that cover less than all of the FETs in the amorphous silicon array, in an effort to prevent or minimize artifacts caused by FET photoconduction, while causing only a minimal increase, if any, in data line capacitance and/or electronic noise.

Figure 4:
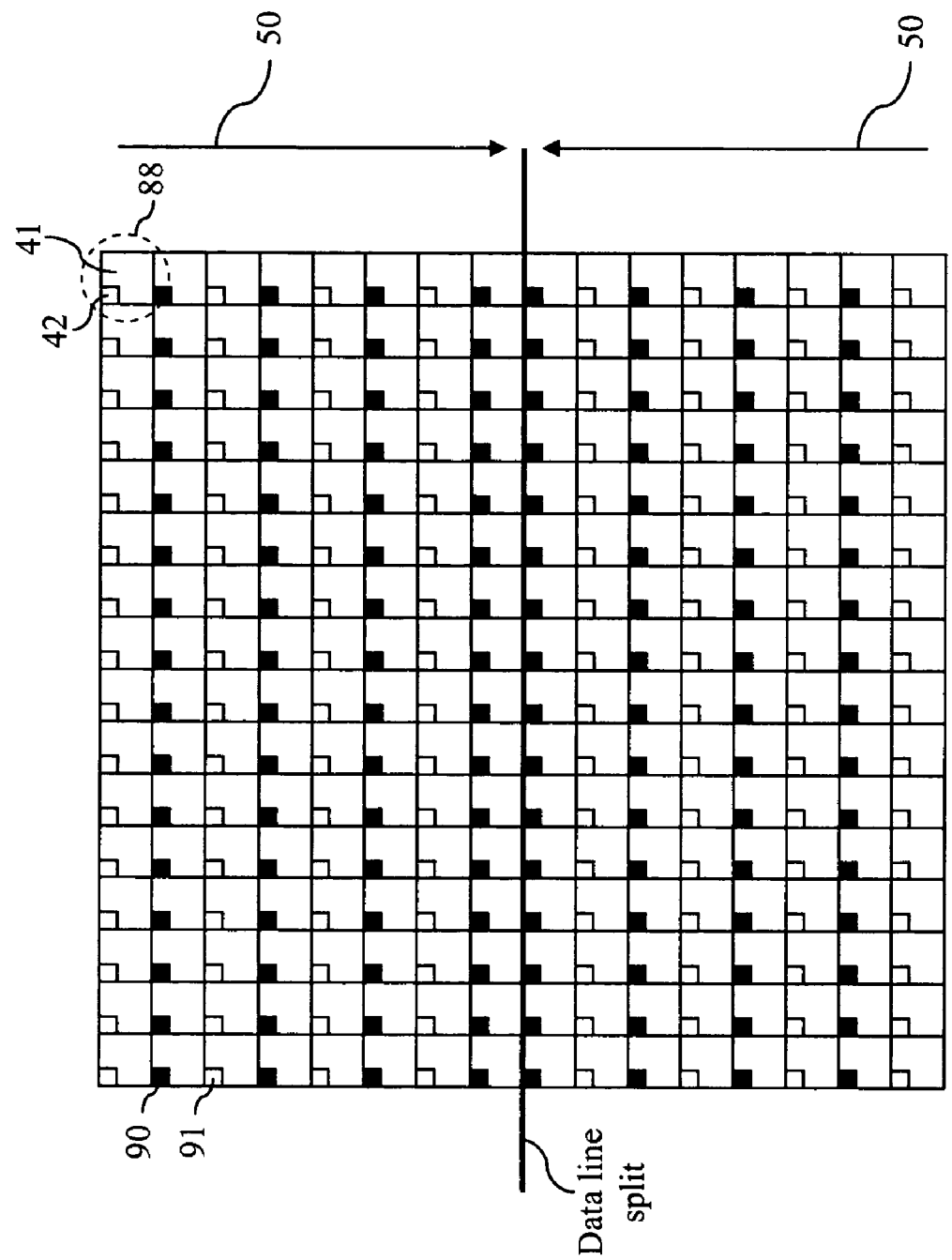
FIG. 4 is a schematic diagram showing one exemplary patterned light-blocking layer that is utilized in embodiments of this invention.

The light-blocking layers of this invention are patterned so that some of the FETs in the amorphous silicon array are protected by light block, while others are not. These light-blocking layers cover at least a portion of the photosensitive region on each light-blocked FET. Numerous different light-blocking layer patterns are possible. One exemplary patterned light-blocking layer that is utilized in embodiments of this invention is shown in FIG. 4. As shown herein, each pixel 88 comprises a photodiode 41 and a FET 42. As also shown herein, the light-blocking layer is patterned so that light block 90 is included over half the FETs, while the remaining FETs have no light block 91 over them. In this embodiment, light block 90 is included on alternating rows of FETs, while the other alternating rows of FETs are left without light block 91. This patterned light-blocking layer reduces the FET photoconductive leakage by a factor of about two as compared to using no light block at all. This patterned light-blocking layer also increases the data line capacitance by about half as much as using light block on all the FETs. While the increase in electronic noise due to the increase in the data line capacitance depends on the relative amounts of all electronic noise sources, in a typical large area panel, it has been found that reducing the increase in data line capacitance by a factor of about two reduces the increase in the total electronic noise by a factor of about two.

Figure 5:
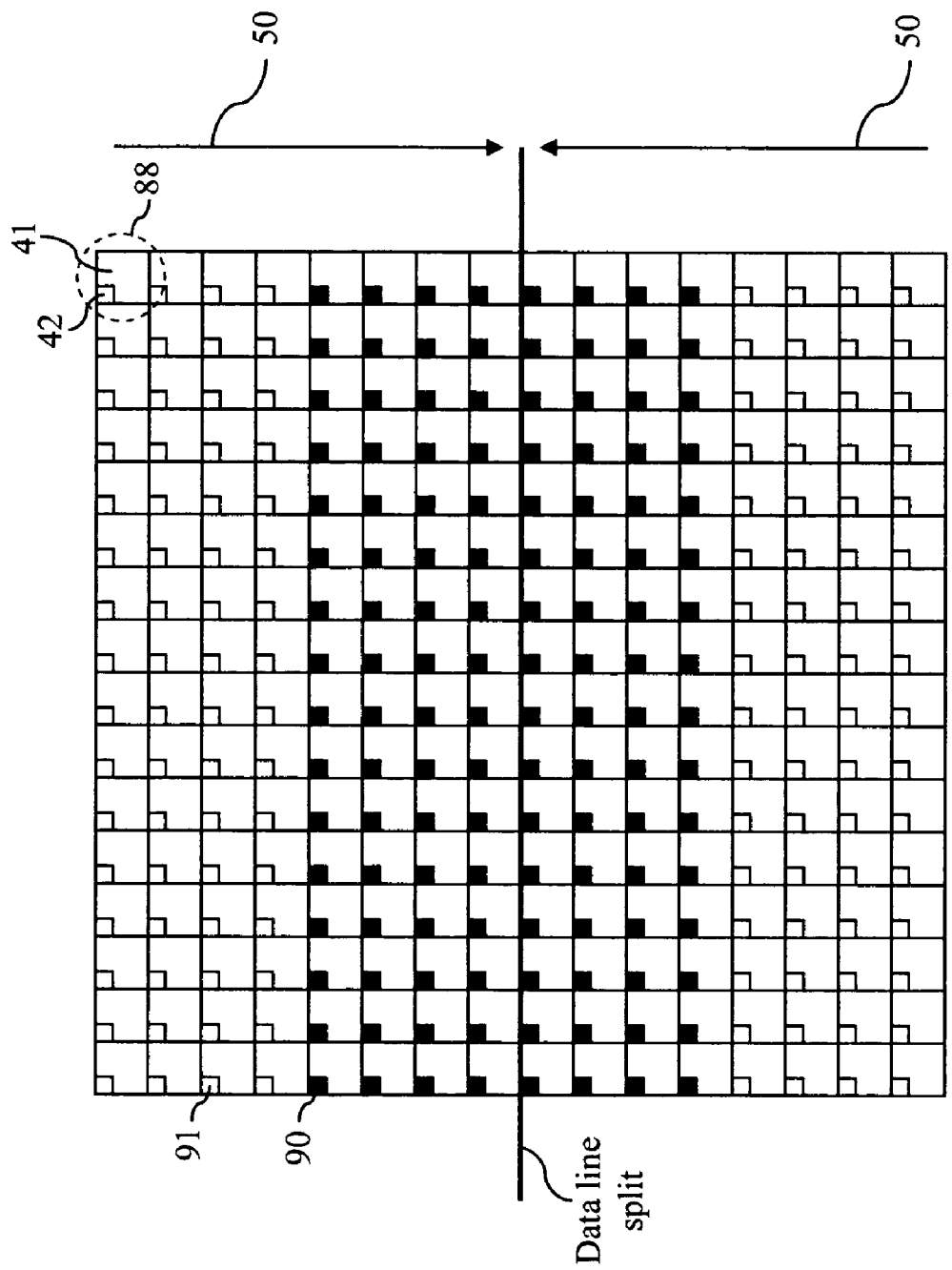
FIG. 5 is a schematic diagram showing another exemplary patterned light-blocking layer that is utilized in embodiments of this invention.

Referring now to FIG. 5, there is shown another exemplary patterned light-blocking layer that is utilized in embodiments of this invention. As shown herein, each pixel 88 comprises a photodiode 41 and a FET 42. As also shown herein, the light-blocking layer is patterned so that light block 90 is included over half the FETs, while the remaining FETs have no light block 91 over them. In this embodiment, light block 90 is included on the portion of the FETs that are read out last since they are the major contributors to the FET photoconductive leakage problem. Arranging the patterned light-blocking layer in this manner reduces the FET photoconductive leakage, and reduces the increase in data line capacitance, and therefore, also reduces the increase in electronic noise.

Numerous other light-blocking layer patterns are also possible. Different fractions of the FETs 42 may be shielded by light block 90, or different arrangements of the FETs 42 that are shielded by light block 90 are possible. However configured, these light-blocking layers provide substantially artifact-free images with low additive electronic noise. Therefore, they are superior to existing light-blocking layers.

These light-blocking layers may comprise any suitable material that blocks and/or absorbs light, that is opaque to light, and/or that is not transparent, such as for example, a light-absorbing conductive metal or other material such as molybdenum (Mo), aluminum (Al), tantalum (Ta), tungsten (W), chromium (Cr), silver (Ag), titanium (Ti), tin (Sn), zirconium (Zr), or gold (Au); a semiconductor material such as p+ amorphous silicon, n+ amorphous silicon, or undoped amorphous silicon; a light-absorbing nonconductive material such as "black" polyimide; a metal oxide; or a metal compound. In some embodiments, the light block 90 comprises a material that is the same material that the row electrodes 70 and column electrodes 68 comprise.

These light-blocking layers may be applied as a separate layer during manufacture of the amorphous silicon arrays. Alternatively, these light-blocking layers could be incorporated into an existing layer in the amorphous silicon arrays, thereby minimizing the number of processing steps that are required during manufacturing.

The light-blocking layers described herein may be used in numerous radiation imaging applications, such as, but not limited to, medical imaging (i.e., x-ray, computed tomography, volume computed tomography, etc.), nondestructive imaging and/or testing of parts, and for detecting contraband (i.e., weapons, explosives, etc.).

As described above, this invention provides light-blocking layers that prevent or minimize FET photoconductive leakage while reducing or minimizing the increase in data line capacitance and electronic noise. Advantageously, these light-blocking layers can be easily incorporated into existing amorphous silicon flat panel x-ray detector systems and improve the performance thereof. Many other advantages will also be apparent to those skilled in the relevant art.

Various embodiments of this invention have been described in fulfillment of the various needs that the invention meets. It should be recognized that these embodiments are merely illustrative of the principles of various embodiments of the present invention. Numerous modifications and adaptations thereof will be apparent to those skilled in the art without departing from the spirit and scope of the present invention. For example, this invention is not limited to the use of photodiodes and FETs. These were discussed herein for exemplary purposes only. Numerous other suitable light-sensitive imaging elements or photosensors and/or switching elements may be used without deviating from the spirit and scope of this invention. Additionally, while the embodiments shown and described herein are commonly utilized in medical imaging, this invention may be utilized for other types of radiation imaging without deviating from the spirit and scope of this invention. Furthermore, while only two different patterned light-blocking layers have been described herein, any suitable light-blocking pattern that blocks light from less than all of the switching elements may be used. Thus, it is intended that the present invention cover all suitable modifications and variations as come within the scope of the appended claims and their equivalents.

What is claimed is:

1. A spatially patterned light-blocking layer for an amorphous silicon flat panel x-ray detector, wherein the spatially patterned light-blocking layer blocks light from a predetermined number of switching elements in the detector, wherein the predetermined number comprises half or less than all of the switching elements in the detector.

2. The spatially patterned light-blocking layer of claim 1, wherein the spatially patterned light-blocking layer blocks light from each switching element in a predetermined arrangement of switching elements that are read out last.

3. The spatially patterned light-blocking layer of claim 1, wherein the spatially patterned light-blocking layer is incorporated into an existing layer in the amorphous silicon flat panel x-ray detector.

4. The spatially patterned light-blocking layer of claim 1, wherein the spatially patterned light-blocking layer is incorporated as an additional layer in the amorphous silicon flat panel x-ray detector.

5. The spatially patterned light-blocking layer of claim 1, wherein the spatially patterned light-blocking layer comprises a material that is opaque to light.

6. The spatially patterned light-blocking layer of claim 5, wherein the material comprises at least one of: a light-absorbing conductive material, a semiconductor material, a light-absorbing nonconductive material, a metal oxide, a metal compound, molybdenum (Mo), aluminum (Al), tantalum (Ta), tungsten (W), chromium (Cr), silver (Ag), titanium (Ti), tin (Sn), zirconium (Zr), gold (Au), p+ amorphous silicon, n+ amorphous silicon, undoped amorphous silicon, and "black" polyimide.

7. A radiation imaging detector comprising:
a detector substrate;
an amorphous silicon array disposed on the detector substrate, the amorphous silicon array comprising:
a plurality of light-sensitive imaging elements; and
a plurality of switching elements, each switching element operatively coupled to an associated light-sensitive imaging element;
a scintillator disposed over and optically coupled to the amorphous silicon array; and
a spatially patterned light-blocking layer positioned to block light from a predetermined number of switching elements in the detector, wherein the predetermined number comprises half or less than all of the switching elements in the detector.

8. The radiation imaging detector of claim 7, wherein the spatially patterned light-blocking layer comprises a material that is opaque to light.

9. The radiation imaging detector of claim 8, wherein the material comprises at least one of: a light-absorbing conductive material, a semiconductor material, a light-absorbing nonconductive material, a metal oxide, a metal compound, molybdenum (Mo), aluminum (Al), tantalum (Ta), tungsten (W), chromium (Cr), silver (Ag), titanium (Ti), tin (Sn), zirconium (Zr), gold (Au), p+ amorphous silicon, n+ amorphous silicon, undoped amorphous silicon, and "black" polyimide.

10. The radiation imaging detector of claim 7, wherein each switching element comprises a field effect transistor.

11. The radiation imaging detector of claim 7, wherein each light-sensitive imaging element comprises at least one of: a photodiode, and a phototransistor.

12. The radiation imaging detector of claim 7, wherein the spatially patterned light-blocking layer blocks light from each switching element in a predetermined arrangement of switching elements that are read out last.

13. The radiation imaging detector of claim 7, wherein the spatially patterned light-blocking layer is incorporated into an existing layer in the amorphous silicon array.

14. The radiation imaging detector of claim 7, wherein the spatially patterned light-blocking layer comprises an additional layer in the amorphous silicon array.

15. The radiation imaging detector of claim 7, wherein the radiation imaging detector is used for at least one of: medical imaging, nondestructive testing of parts, and detecting contraband.

16. A spatially patterned light-blocking layer for an amorphous silicon flat panel x-ray detector, wherein the spatially patterned light-blocking layer blocks light from a predetermined number of switching elements in the detector, wherein the predetermined number comprises less than all of the switching elements in the detector, wherein the spatially patterned light-blocking layer blocks light from each switching element in a predetermined arrangement of switching elements that are read out last.

* * * * *